United States Patent
Harper et al.

(10) Patent No.: US 6,865,503 B2
(45) Date of Patent: Mar. 8, 2005

(54) METHOD AND APPARATUS FOR TELEMETERED PROBING OF INTEGRATED CIRCUIT OPERATION

(75) Inventors: George Harper, Weston, MA (US); Mark L. Erlenborn, Naperville, IL (US); Keith A Kind, Mission Viejo, CA (US); Welborn R Malpass, Evergreen, CO (US); Sam L. Spencer, San Diego, CA (US); Kewei Yang, San Jose, CA (US); Jeff R. Gemar, Superior, CO (US)

(73) Assignee: Conexant Systems, Inc., Newport Beach, CA (US)

( * ) Notice: Subject to any disclaimer, the term of this patent is extended or adjusted under 35 U.S.C. 154(b) by 248 days.

(21) Appl. No.: 10/330,797

(22) Filed: Dec. 24, 2002

(65) Prior Publication Data

US 2004/0113809 A1 Jun. 17, 2004

(51) Int. Cl.$^7$ .......................... G06F 19/00; G01R 31/303
(52) U.S. Cl. ................... 702/122; 702/120; 324/754; 324/763; 324/765; 714/733
(58) Field of Search .............................. 702/122, 117, 702/118, 120; 324/754, 537, 750, 555, 763, 765; 714/724, 733, 734

(56) References Cited

U.S. PATENT DOCUMENTS

| | | | | | |
|---|---|---|---|---|---|
| 5,218,294 A | * | 6/1993 | Soiferman | ............... | 324/158.1 |
| 6,161,205 A | * | 12/2000 | Tuttle | ............... | 714/724 |
| 6,189,120 B1 | * | 2/2001 | Akram | ............... | 714/724 |
| 6,331,782 B1 | * | 12/2001 | White et al. | ............... | 324/763 |
| 6,349,396 B2 | * | 2/2002 | Akram | ............... | 714/724 |
| 6,357,025 B1 | * | 3/2002 | Tuttle | ............... | 714/724 |
| 6,455,766 B1 | * | 9/2002 | Cook et al. | ............... | 136/244 |
| 6,484,279 B2 | * | 11/2002 | Akram | ............... | 714/724 |
| 6,640,323 B2 | * | 10/2003 | Akram | ............... | 714/724 |
| 6,658,368 B2 | * | 12/2003 | Wagner et al. | ............... | 702/180 |
| 6,686,755 B2 | * | 2/2004 | White et al. | ............... | 324/763 |
| 6,686,760 B2 | * | 2/2004 | Hirt | ............... | 324/765 |
| 6,731,122 B2 | * | 5/2004 | Feng | ............... | 324/752 |
| 6,759,850 B2 | * | 7/2004 | Harzanu et al. | ............... | 324/522 |
| 6,759,863 B2 | * | 7/2004 | Moore | ............... | 324/765 |
| 6,788,093 B2 | * | 9/2004 | Aitren et al. | ............... | 324/765 |
| 2004/0119069 A1 | * | 6/2004 | Gemar et al. | ............... | 257/48 |

* cited by examiner

*Primary Examiner*—Patrick Assouad
(74) *Attorney, Agent, or Firm*—Jack I. J'Maev (57) ABSTRACT

State of test points on an integrated circuit are encapsulated in a telemetry frame that is wirelessly conveyed to a test system. Test points may be logic levels or analog levels converted into representative multi-bit values. Conveyance off the circuit may be by radio frequency or optical emission.

24 Claims, 4 Drawing Sheets

METHOD AND APPARATUS FOR TELEMETERED PROBING OF INTEGRATED CIRCUIT OPERATION

FIELD OF THE INVENTION

This invention relates generally to the field of testing integrated circuits and more specifically to built-in-test equipment and supporting test apparatus.

BACKGROUND OF THE INVENTION

Physically, electronic semiconductors are fabricated by etching geometric patterns into wafers of silicon or other semi-conductive material. The geometric patterns are typically used to define regions on the wafer that will be chemically doped in order to create transistors and various other devices. By providing conductive paths on the wafer, devices such as transistors can be electrically connected to other transistors or devices in order to form very complex circuits. The resulting circuits are known as "integrated circuits".

Integrated circuits are much like any other electronic system. A collection of functional circuits may be combined to accomplish a particular function. In many ways, an integrated circuit can be compared to a printed circuit board that is populated with transistors and other components. Where the printed circuit board uses traces etched from a copper sheet adhered to its surface to connect components together, the integrated circuit uses the conductive paths to connect one component to the next.

When a printed circuit board is assembled, it generally needs to be tested to make sure it is functioning properly. Modernly, testing of circuit boards requires attachment of the circuit board to a test system. The test system normally uses a multiplicity of physical connections to monitor the state of "test points" on the circuit board. These test points are normally defined when the circuit board is first designed. They are usually selected because the activity that is exhibited at the test point is indicative of the overall health of the completed circuit board being tested. Literally, the number of test points that must be monitored to test a complicated circuit board may reach into the hundreds, but many circuit boards may be tested with less than a hundred test points. In most instances, all of the test points must be monitored simultaneously. This means that a separate physical connection must be provided from each test point to the test system.

Testing an integrated circuit is just as, or perhaps even more complicated than testing an assembled circuit board. First, the integrated circuit is usually tested at several stages of the manufacturing process. When the integrated circuit is manufactured, it is generally fabricated on a wafer. The wafer may actually contain hundreds of instances of the same integrated circuit pattern. After the wafer is fabricated, it is physically sawed apart to separate the individual integrated circuits into die. Each resulting die is a fungible product that may eventually be shipped to a customer as an integrated circuit.

Before an individual die can be shipped, it is usually encapsulated into a plastic molded package. Pins of a plastic package are connected with micro-fine wires to connection points on the integrated circuit that are known as bonding pads. The bonding pads are normally much larger than other features on an integrated circuit because each bonding pad must be large enough to accommodate a connection wire. The pins protrude through the encapsulant so that the integrated circuit can be connected to a circuit board like any other electronic component.

The task of packaging an integrated circuit is very time consuming and expensive. This means that individual die must be tested before they are packaged to ensure that defective components are not packaged. Once the device is actually packaged, it must be tested again to verify that the packaging was properly done. This is usually performed to make sure that all of the physical connections from the bonding pads on the integrated circuit are all connected to the pins that are used to connect the integrated circuit to a printed circuit board.

Testing an integrated circuit is difficult, due mainly to its miniature features. In order to properly test an integrated circuit, additional bonding pads may need to be provided on the silicon die. Because bonding pads are so much larger than other circuit elements, they waste space that could otherwise be used for functional circuitry. As a result, the number of components that can be produced from a single wafer, or yield, may be reduced. For this reason, many integrated circuit designs limit the number of additional test points that are provided for functional testing.

Testing an unpackaged integrated circuit is also physically dangerous to the device under test. In order to make contact with the bonding pads on an integrated circuit, a physical connection is normally made by means of an apparatus known as a "flying probe". The flying probe is a robotic electrical probe that can be directed numerically to a bonding pad. The contact pressure that the flying probe exerts on the bonding pad may also damage the integrated circuit.

Once the integrated circuit is packaged, it may still be damaged during the testing process. Semiconductors are very susceptible to damage at a molecular level by electrical static discharge (ESD). Whenever two different materials come in contact with each other, there is a voltage difference between them. If the voltage difference is large enough, a sudden current flow may be induced as the voltage between the two materials equalizes. During testing, the integrated circuit may be damaged if it comes into contact with another object. If the voltage difference between the integrated circuit and the other object, such as a test probe or human being, is large enough, the static discharge may damage the device. This kind of ESD damage can also occur when the integrated circuit is tested before it is packaged.

Recognizing the problem of handling integrated circuits during testing, White et al. (U.S. Pat. No. 6,331,782) teaches that a test point on an integrated circuit can be monitored wirelessly. According to White, the electrical state of a test point can be used to modulate a carrier or effect some other wireless communications such as electromagnetic coupling or optical signals. A test apparatus can demodulate the carrier or receive a different wireless conveyance in order to monitor the status of the test point.

Although White addresses the issues of physical damage that can be associated with contact-oriented probing of an integrated circuit, his method does not address the real problem with testing an integrated circuit, or for that matter, even a complicated printed circuit board assembly. In order to be effective, any contact-oriented testing method must be capable of simultaneously monitoring a plurality of test points. Whether the testing involves an integrated circuit, a printed circuit board or some higher-level electronic assembly, a test apparatus must have simultaneous access to the test points in order to properly validate circuit operation.

The flying probe can only make a very limited number of simultaneous connections. Anyway, the physical area of each bonding pad may limit the number of test points; the number of contact limitations of the flying probe may be moot in this instance. White's wireless technique is limited to only one test point. In fact, White admits that if additional test points need to be monitored, additional carriers at other frequencies must be used. In one alternative, White suggests that a spread spectrum transmitter could be used to convey the state of a plurality of test points on an integrated circuit; each test point could be distinguished by a different spread-spectrum frequency hopping sequence. Either of these methods would require significant and very complex circuitry on the integrated circuit. This additional circuitry could have a counterproductive effect on production yield much like that associated with the use of an excessive number of bonding pads for individual test points.

SUMMARY OF THE INVENTION

The present invention comprises an integrated circuit fabricated and tested according to a method for manufacturing integrated circuits whereby test points on an integrated circuit may be monitored by a test apparatus using a single wireless channel. According to this method, a plurality of test points may be identified within the integrated circuit. The electrical state present at each test point may then be incorporated into telemetry stream. The telemetry stream may then be used to modulate an output signal. The output signal ultimately may be used to drive a transducer so that a wireless conveyance to a test apparatus may be accomplished.

The method of the present invention provides that various test points may be represented by information conveyed by the telemetry stream during particular time slots. An integrated circuit may also be manufactured according to a method wherein various test points are assigned to particular time slots in the repeating data sequence. As various time slots occur, the electrical state of the corresponding test point may be represented in the telemetry stream.

According to one example method of the present invention, the electrical state any test point may be represented as a binary logic value. The binary logic value may then be stored until it is time to transmit the state of the binary logic value in the telemetry stream. Other test points on the integrated circuit may require voltage sensing. In this case, the voltage level at the test point may be converted into a representative digital value. This digital value may also be stored until the appropriate time slot comprising the telemetry stream occurs.

Once the telemetry stream is created, the method of the present invention provides for various methods of conveying the telemetry stream to a test apparatus. For instance, one derivative method of the present invention may convey information by generating an oscillating carrier signal and then varying the oscillating carrier signal according to the telemetry stream. This may be accomplished by varying the carrier in amplitude or frequency. Yet another derivative method that illustrates a feature of the present invention provides for changing the frequency of the oscillating carrier according to a repeating numeric sequence. This results in a spread-spectrum modulation of signals used to transmit the telemetry stream. Yet another example method of the present invention provides for the telemetry stream may be used to cause the status of the carrier signal to be shifted.

According to one alternative method of the present invention, the telemetry stream may be used to generate the binary levels that may be suitable to drive a transducer. In one example method, a transducer may be caused to radiate optical energy when driven by one binary level. The second binary level that is compliment to the first binary level may be used to preclude the radiation of optical energy.

The present invention further comprises an integrated circuit comprising application-specific circuitry and a test-point capture circuit that is able to capture the electrical state of predefined test points within the application-specific circuitry. According to one embodiment of the present invention, the integrated circuit further comprises the telemetry formatter that generates a telemetry stream by incorporating the capture electrical state of the test points.

In order to provide the capability to convey the telemetry stream off of the integrated circuit in a wireless manner, the integrated circuit may further comprises a modulator that may generate a signal that is modulated according to the telemetry stream. This signal may then the used to drive a transducer that may further comprise integrated circuit. It should be noted that the transducer may then emits energy from the integrated circuit that may be captured by an external test apparatus.

One illustrative embodiment of this invention provides a test point capture circuit comprising a comparator. The comparator may output in binary logic level based on the voltage that may be present any particular test point. A flip-flop may then be used to store the binary logic level in accordance with a sample signal. In some cases, it may be desirable to telemeter the voltage level that may be one alternative embodiment of this invention present any particular test point on the integrated circuit. One embodiment of this invention provides an analog-to-digital converter that may generate a digital value according to the voltage level present at the test point. This digital value may then be stored in a register.

At least one example embodiment of the present invention provides a telemetry formatter comprising a state machine for controlling the generation of a telemetry stream and a shift register that may be used to store a plurality of data bits and then generate a serial data stream based on the data bits captured by the shift register. Typically, various data bits corresponding to logic levels of particular test points may be stored in the shift register when the control state machine asserts a load signal. Where an analog voltage level must be telemetered, the digital value comprising a plurality of parallel bits may also be stored in the shift register.

According to this illustrative embodiment of the present invention, the control state machine comprising the telemetry formatter may generate a telemetry frame stored identifier by manipulating the state of the telemetry stream. Generally, the control state machine will vary the output of the telemetry stream to form a particular serial pattern comprising a telemetry frame start identifier. Once the control state machine has injected the telemetry frame start identifier into the telemetry stream, it may then cause the shift register to generate a stream of digital data by asserting a shift signal.

According to one alternative embodiment of the present invention, the modulator may comprise an oscillator that generates a carrier signal. Further comprising the modulator adjustment circuit may vary the oscillating carrier signal according to the telemetry stream. The oscillator may itself comprise numeric sequence generator that may drive a numerically controlled frequency synthesizer with the numeric sequence. This embodiment of the present invention may be used to modulate the carrier in a spread-spectrum manner. According to one alternative embodiment of the present invention the adjustment circuit may comprise in amplitude modulator for adjusting the amplitude of the oscillating carrier signal according to the telemetry stream. In one alternative embodiment, the adjustment circuit may comprise the variable voltage device that may be used to adjust the output frequency of the oscillator according to the telemetry stream. Yet another alternative embodiment of the present invention, the adjustment circuit may be a phase shifter that varies the phase of the oscillating carrier signal in accordance with the telemetry stream.

Another feature of the present invention is illustrated in an embodiment wherein the modulator is a comparator that generates a logic level in accordance with the telemetry stream. This may be used to drive an optical emitter in order to wirelessly convey the telemetry stream from the integrated circuit. In those cases where a radio frequency signal is used to convey the telemetry stream to a test apparatus, the integrated circuit may further comprise an antenna that may radiate energy according to a modulated, oscillating carrier signal.

BRIEF DESCRIPTION OF THE DRAWINGS

The foregoing aspects are better understood from the following detailed description of one embodiment of the invention with reference to the drawings, in which.

DETAILED DESCRIPTION OF THE INVENTION

Figure 1:
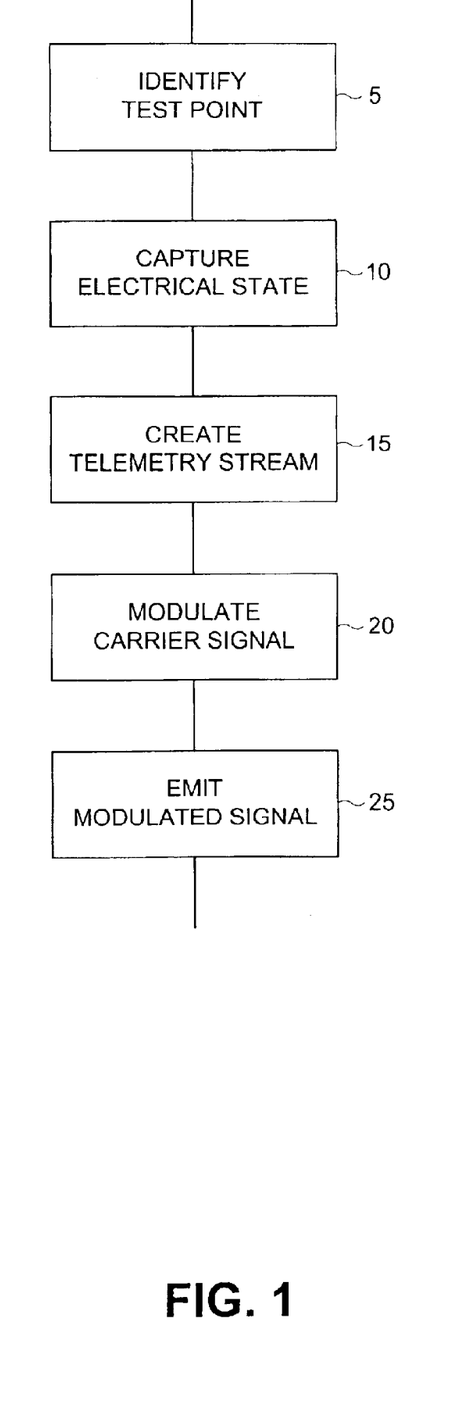
FIG. 1 is a flow diagram that depicts one example method for manufacturing an integrated circuit by telemetric probing of integrated circuit operation.

FIG. 1 is a flow diagram that depicts one example method for manufacturing an integrated circuit by telemetric probing of integrated circuit operation. In this example method, a test point is identified within an integrated circuit (step 5). The test point may be selected according to various criteria at the design stage of the circuit. For example, during the design and simulation of the circuit a certain test point in the circuit may be monitored using computer aided design (CAD) tools. The same test point may be created in the physical layout and selected according to the method of the present invention thus allowing direct correlation between simulation test data and a physical circuit.

An alternative test point selection criteria may be the selection of a test point based on the impedance of the circuitry at the test point. Monitoring circuitry may influence to a greater or lesser extent the electrical state of the circuit at the point of connection of the test point to the circuit. Choice of a low impedance test point may reduce the effect of any monitoring circuitry that may be used by other aspects of the present invention. In one example method for selection of a test point, the test point may be connected directly to the output of a buffer circuit. In a second alternative method, the selection of the test point may be based on the physical location of the test point on the surface of a monolithic integrated circuit substrate. The choice of physical location may be made at the layout stage of an integrated circuit.

In yet another alternative method, the test point may be incorporated into a macro circuit element. Alternatively, the test point may be considered a macro circuit and may be in and of itself incorporated into a circuit design in the same manner as any other circuit element.

Having selected the test point, the test point may be used to capture the state of an electrical signal (step 10). The electrical state may be captured according to one example method of the present invention as a binary logic level and may further be buffered at the output by a buffer circuit. The low impedance side of the buffer circuit is one suitable test point for the capture of a binary logic level. In an alternative method of the present invention, the electrical state may additionally be captured after a resynchronization circuit has resynchronized the electrical state. In the case of an electrical state that is captured by a resynchronization circuit, the electrical state may be captured at a first test point and then recaptured at a second test point. Both the first test point and the second test point may be selected based on the criteria described above or may be selected using any other criteria deemed applicable by those skilled in the art.

In another alternative method, a comparator may be provided which accepts a first electrical state as one input to the comparator and outputs a second electrical state as a function of a comparison performed between the first electrical state and reference electrical level. A variation of this method is one in which the electrical state of a test point is a first binary logic level. The first binary logic level may be combined in a logic circuit with a second binary logic level to provide a binary logic level at the output of the logic circuit that represents the electrical state present at the test point.

In one variation of the method of the present invention, the voltage level at a test point is input to a conversion circuit, which converts the voltage level to a proportionate digital value. The steps used in the technique of data conversion will be familiar to those practiced in the art of data conversion. One data conversion technique is to use a resistor ladder together with a plurality of voltage comparators to capture an analog level to a plurality of bits that may be stored as parallel data. This is one technique may be used to convert the voltage level at a test point to a digital value. The present invention is not limited to the use of this particular data conversion technique.

In a variation of the method of the present invention the proportionate digital value may need to be further resynchronized through a resynchronizer to enable the said digital value to be combined into a telemetry stream along with the digital value derived by the electrical state capture step of the method of the present invention.

Telemetry can be defined as transmission of remote measurement data. In the context of the present invention the telemetry stream is created (step 15) so that the electrical signal captured at a plurality of test points may be combined into a telemetry stream. The combination of a plurality of electrical signals from a plurality of test points into a single telemetry data stream reduces the number of transmitters and receivers that will be used in a complete test system or may increase the number of test points that may be provided by the method of the present invention.

The creation of a telemetry stream allows the electrical states of a plurality of test points to be remotely monitored. In one alternative variation of the present invention a specific framing format of the data incorporated into the data stream may be used in order to simplify the combination of a plurality of electrical states into the telemetry stream. In a variation of the method of the present invention, a predefined, dedicated time slot may be allocated within a repeating data sequence which comprises the telemetry stream. One alternative method of this invention provides that the electrical states of some or all of the test points on an integrated circuit may be captured simultaneously. This enables a "snap-shot" to be taken of a portion or of the entire test state of the integrated circuit. A telemetry stream may then be formed according to the simultaneously stored snap-shot.

The telemetry stream according to the present invention may be used to modulate a carrier signal (step 20). In one example method of the present invention the provision of a plurality of carrier frequencies may be enhanced by the provision of a repeating numeric sequence in a spread spectrum transmission system. The repeating numeric sequence may be a pseudo-random code that may be used to determine the frequency of the carrier signal. In another method of the present invention, the modulation of a carrier signal may be achieved by varying the frequency of the carrier signal. In yet another method of the present invention the telemetry stream is used to modulate the amplitude of a carrier signal.

In yet another alternative method of the present invention the modulation of the carrier signal may be achieved by linearly shifting the phase of the modulated carrier signal with respect to the phase of the unmodulated carrier signal. In a variation of this method the phase of the carrier signal may be shifted non-linearly, also known as phase-shift keying. In yet another alternative method of the present invention the modulation of the carrier signal may be achieved by transmission of binary level values with periods of transmission and of no transmission being used to alternately represent the two binary logic level states, also known as on/off keying. On/off keying may be used in the case where the telemetry data stream is used to drive an optical transducer, notwithstanding the existence of alternative modulation schemes used in the optical transmission of the telemetry data stream described herein.

In the method of the current invention, the modulated signal may be used to drive a transducer and cause it to emit electromagnetic radiation. Emission according to the telemetry stream is achieved by driving a transducer with the modulated carrier (step 25).

Figure 2:
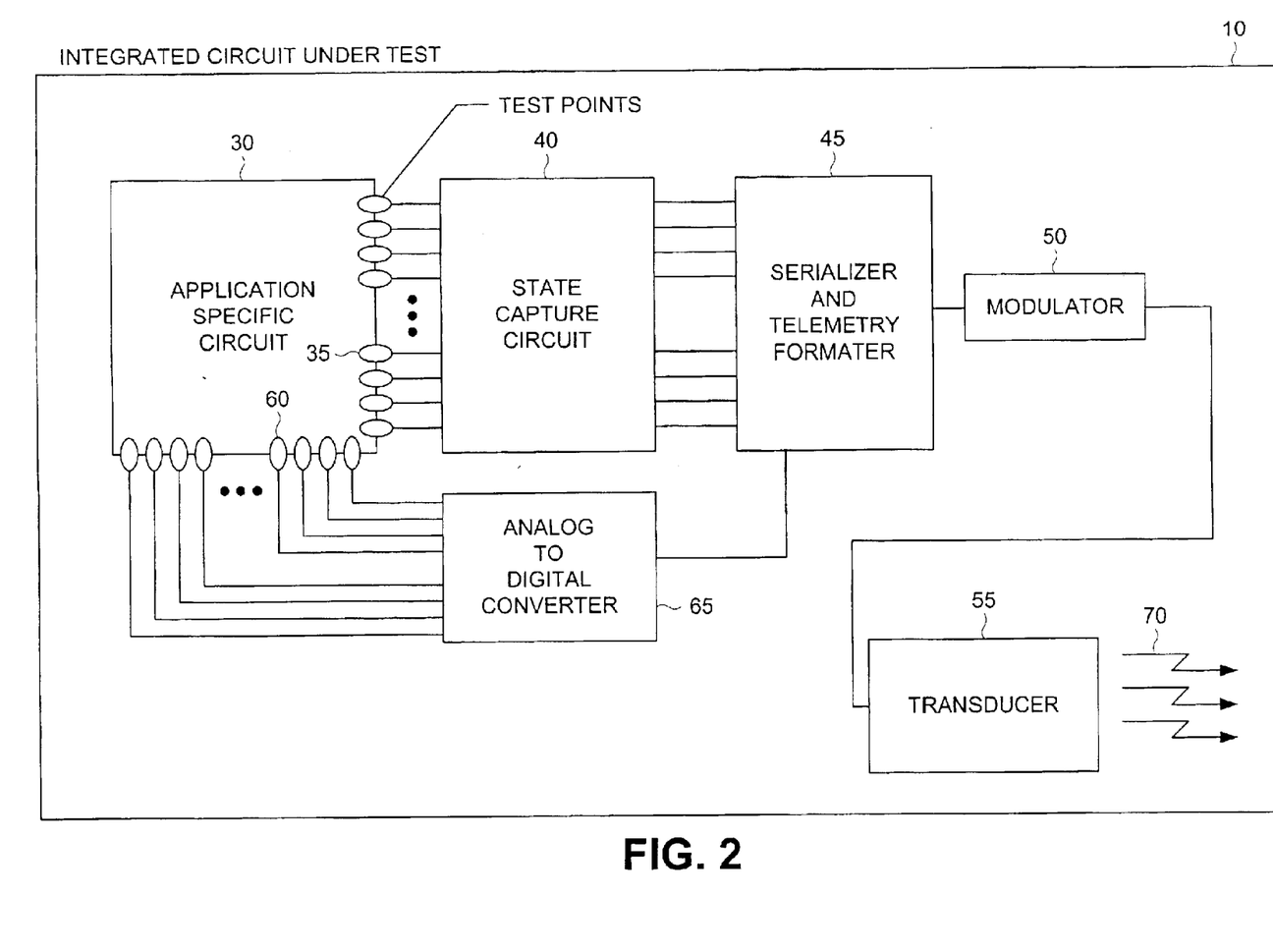
FIG. 2 is a block diagram of one embodiment of an integrated circuit with telemetric testing capability according to the present invention.

FIG. 2 is a block diagram of one embodiment of an integrated circuit with telemetric testing capability according to the present invention. An integrated circuit according to the present invention may comprise application specific circuitry and a telemetry subsystem. The application specific circuitry comprises an application specific functional element 30 and a predefined test point 35 The telemetry subsystem comprises a state capture circuit 40, a telemetry formatter 45, a modulator 50 and a transducer 55. An analog test point 60 and an analog-to-digital converter 65 may also comprise the present invention.

The test point 35 may be connected by means of a coupling trace to the state capture circuit 40. This may compare the electrical state at the test point to a reference voltage and store the result of the comparison as a logic level which is made available by the state capture circuit at its output. The state capture circuit 40 may further be connected by means of an interconnection to the telemetry formatter 45. The application specific circuitry may further comprise a predefined test point 60 that is connected via a coupling trace 5 to the analog-to-digital converter 65. The analog-to-digital converter 65 comprises a sampling circuit, which samples the electrical voltage level at the test point 60 and stores a representative digital value. In one embodiment of the present invention, the connection between the analog-to-digital converter 65 and the telemetry formatter 45 may be comprised of coupling traces on the integrated circuit.

The telemetry formatter 45 may be connected by means of an interconnection to the modulator 50 comprised of an oscillator; the output of the oscillator may be varied according to a base band telemetry stream 47 generated by the telemetry formatter 45 to produce a modulated output signal. In an embodiment of the present invention the modulated output signal is then routed via an interconnection to a transducer 55, which emits an oscillating electromagnetic field 70. In an alternative embodiment of the present invention the modulated signal output is alternatively routed to an optical transducer, which emits optical radiated energy.

In an alternative embodiment of the present invention the base band telemetry stream 47 output from the telemetry formatter 45 is routed via an interconnection to the modulator circuit 50 comprised of an oscillator; the frequency of the oscillator is varied according to a digital value generated by a numeric sequence generator. The oscillator is further comprised of a repeating sequence generator the output of which is combined with the telemetry stream output to produce a modulated output signal driving a numerically controlled frequency synthesizer. The repeating numeric sequence at the output of the repeating sequence generator is composed of digital codes wherein each bit time is called a chip. The effect of the sequence generator is to produce modulation with a higher bandwidth than that of the telemetry stream base-band data by changing the frequency of the oscillating carrier signal. For example, if the repeating sequence generator generates pseudo-random codes having a length of 7 chips, the bandwidth of the telemetry stream data and thenceforth the modulated carrier signal will be multiplied by a factor of 7. This type of modulation may be employed in an embodiment of the present invention to reduce interference from a disturber since the disturber power will be concentrated at a certain peak within the frequency band emitted by the transducer 55 whereas the power of the modulated telemetry stream data has been spread across a wider bandwidth than that occupied by the disturber. The modulated output signal may then be routed via an interconnection to a transducer 55, which emits an electromagnetic field.

In an alternative embodiment of the present invention the telemetry stream output 47 may alternatively be routed to the gain control input of a variable gain amplifier. The signal input to the variable gain amplifier is an un-modulated carrier signal. The output of the variable gain amplifier is a carrier signal having its amplitude modulated by the telemetry stream 47 output of the telemetry formatter 45. The modulated output signal may then be routed via an interconnection to the transducer 55, which emits an electromagnetic field.

In yet another embodiment of the present invention the telemetry stream 47 output of the telemetry formatter 45 may be routed via a coupling trace to the input of an adjustment circuit that is able to provide a control voltage at its output by means afforded to the design of the adjustment circuit. In the same embodiment of the present invention the control voltage is further routed via an interconnection to the input of an oscillator, the frequency of which is varied according to the control voltage at its input. The output of the oscillator is further routed to the transducer 55, which emits an electromagnetic field.

In yet another embodiment of the present invention, the telemetry stream 47 may be routed via an interconnection to the control input of a phase shifting circuit. In one variation of this embodiment, the phase shifting circuit shifts the phase of a carrier signal supplied at its carrier signal input according to the telemetry stream 47. The modulated output signal of the phase shifting circuit may then be routed via an interconnection to the transducer 55, which emits an electromagnetic field.

In yet another embodiment of the present invention, the telemetry stream may be routed via an interconnection to a first input of a comparator. A second input of the comparator is typically connected to an input reference voltage. An output of the comparator is connected to the control voltage input of an optical transducer that controls the emission of the optical transducer.

In an embodiment of the present invention, the transducer 40 may comprise an amplifier, an impedance matching circuit and an antenna. The amplifier receives at its input the output of the modulator 37 and amplifies it in order to cause the antenna to radiate electromagnetic energy. An impedance matching circuit may be connected between the amplifier and the antenna in order to maximize the transfer of energy between the antenna and the free space into which it may radiate.

Figure 3:
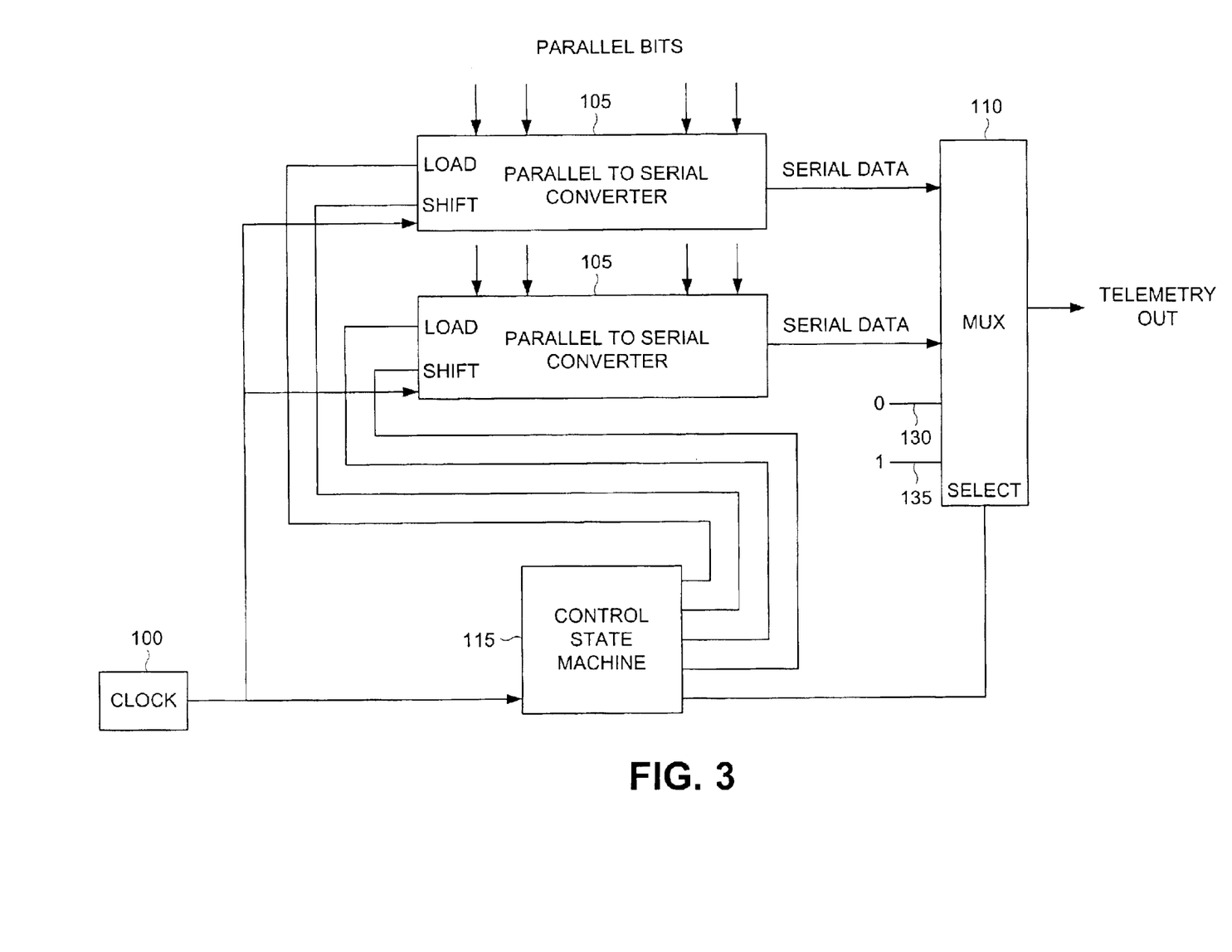
FIG. 3 is a block diagram of one possible embodiment of a telemetry formatter according to the present invention.

FIG. 3 is a block diagram of one possible embodiment of a telemetry formatter according to the present invention. According to one possible embodiment of the present invention, a telemetry formatter 45 may comprise a shift clock generator 100. Further comprising the telemetry formatter 45 may be one or more parallel-to-serial converters 105. Each parallel-to-serial converter 105 typically comprises a plurality of parallel inputs that may be used to capture logic states from various test points on an integrated circuit manufactured according to the methods of the present invention. In the event that more than one parallel-to-serial converter 105 is provided in a particular embodiment of the invention, the telemetry formatter 45 may further comprise a multiplexer 110.

According to this illustrative embodiment of the invention, the telemetry formatter 45 may further comprise a control state machine 115. The control state machine 115 may be used to control loading of data into the data registers comprising one or more parallel-to-serial converters 105. One alternative embodiment of the present invention provides that some or all of the parallel-to-serial converters provided on an integrated circuit should be loaded simultaneously to form a snap-shot of the state of all parallel inputs received by all of the parallel-to-serial converters. Hence, the control state machine 115 may cause some or all of the parallel-to-serial converters to be loaded with the same signal.

Once data is loaded into the parallel-to-serial converters 105, the control state machine 115 may cause one of the parallel-to-serial converters 105 to begin shifting parallel data that it captured to form a serial data stream 120. In those embodiments wherein more than one parallel-to-serial converters are provided, the control state machine 115 typically causes a multiplexer 110 to select a serial data stream 120 from the parallel-to-serial converter actively shifting parallel data to form the serial data stream 120.

The telemetry formatter 45 may need to generate special data sequences that may constitute identifiers for the beginning and/or ending of a telemetry frame. The telemetry formatter 45 may also need to generate telemetry frame identifiers. Accordingly, the control state machine 115 may cause the multiplexer 110 to select either a logic "0" 130 or a logic "1" 135 in order to form special serial patterns that may comprise these identifiers.

Figure 4:
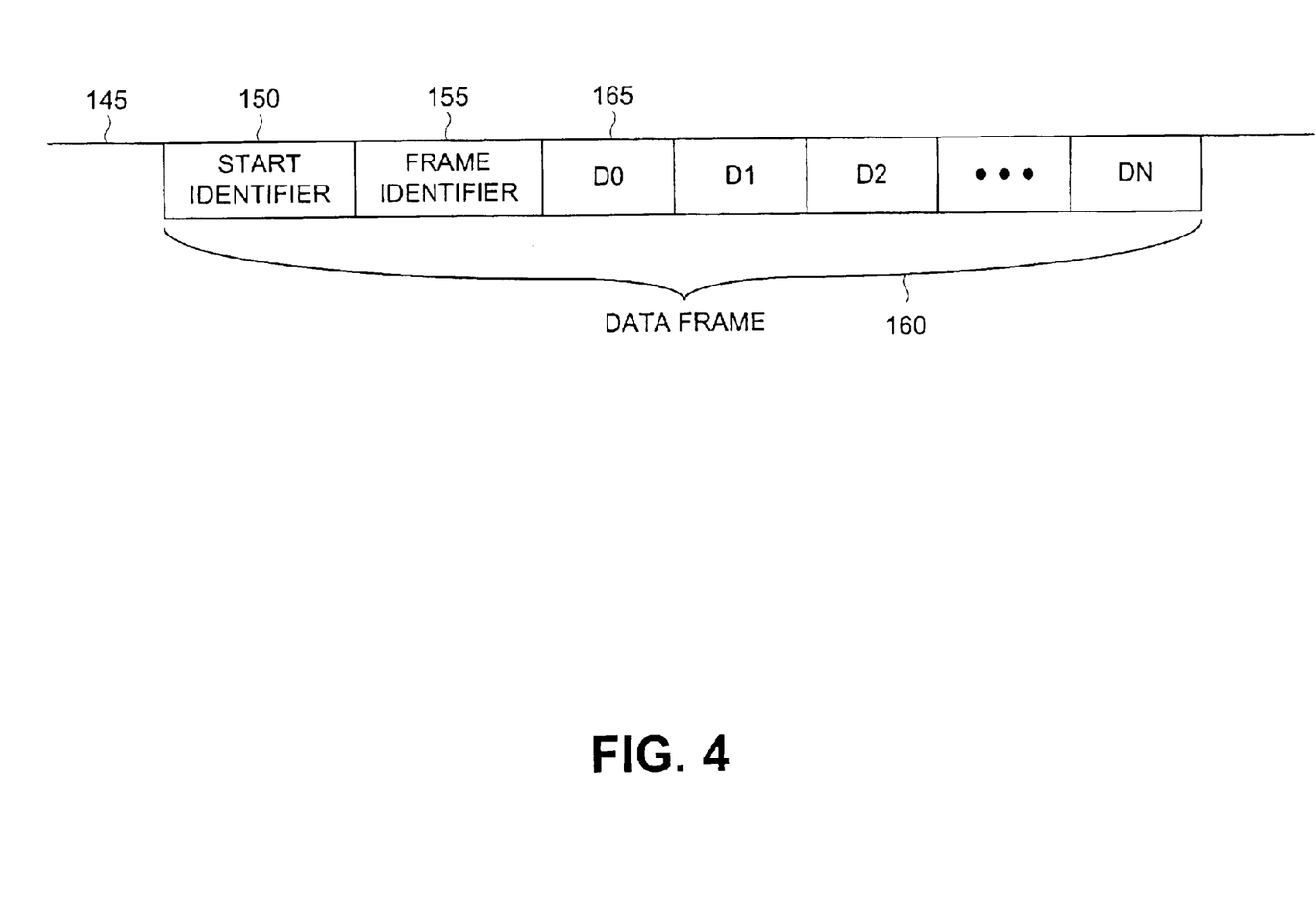
FIG. 4 is a pictorial representation of one possible structure for a telemetry stream generated by a telemetry formatter according to the present invention.

FIG. 4 is a pictorial representation of one possible structure a telemetry stream generated by a telemetry formatter according to the present invention. According to one embodiment of the telemetry formatter, the control state machine 115 may cause the first parallel-to-serial converter to begin generating a serial data stream. Before commanding the first parallel-to-serial converter to begin generating the serial data stream, the control state machine 115 may typically causes the serial output to exhibit a start identifier 150. The start identifier may be some identifiable sequence of serial bits that may be preceded by a significant period of inactivity 145 in the telemetry stream. Following the start identifier 150, the control state machine 115 may inject a frame identifier 155 into the telemetry stream. Generally, the frame identifier 155 injected into the telemetry stream may be used to represent which parallel-to-serial converter will be used as a source of serial data for a particular data frame 160. The control state machine 115 generally uses the multiplexer 110 to select logic zeros 130 and ones 135. Differing logic states may then be sequentially selected to form serial identifiers in the telemetry stream.

Once the frame identifier 155 has been injected into the telemetry stream, the control state machine 115 may then cause the selected parallel-to-serial converter to generate a data stream. It should be noted that various parallel inputs received by a particular parallel-to-serial converter may correspond to time slots 165 comprising the data frame 160.

While this invention has been described in terms of several preferred embodiments, it is contemplated that alternatives, modifications, permutations, and equivalents thereof will become apparent to those skilled in the art upon a reading of the specification and study of the drawings. It is therefore intended that the true spirit and scope of the present invention include all such alternatives, modifications, permutations, and equivalents.

What is claimed is:

1. An integrated circuit fabricated and tested according to a method comprising the steps of:

identifying a plurality of test points within the integrated circuit;

capturing the electrical state present at the test points;

incorporating the electrical state present at the test points into a telemetry stream;

modulating an output signal according to the telemetry stream; and emitting energy from a transducer driven by the output signal.

2. The integrated circuit yielded by the method of claim 1 wherein the step of capturing the electrical state present at the test points comprises the steps of:

representing the electrical state present at one of the test point as a binary logic state in accordance with the voltage present at the electrical test point; and storing the logic level.

3. The integrated circuit yielded by the method of claim 1 wherein the step of capturing the electrical state present at the test point comprises the steps of:

converting the voltage level present at the test point to a digital value; and storing the digital value.

4. The integrated circuit yielded by the method of claim 1 wherein the step of incorporating the electrical state present at the test point into a telemetry stream comprises the steps of:

assigning the test point to a time slot in a repeating data sequence; and outputting the electrical state present at the test point during the assigned time slot.

5. The integrated circuit yielded by the method of claim 1 wherein the step of modulating an output signal according to the telemetry stream comprises:

generating an oscillating carrier signal; and varying the oscillating carrier signal according to the telemetry stream.

6. The integrated circuit yielded by the method of claim 5 wherein the step of emitting energy from a transducer driven by the output signal comprises the step of radiating an oscillating electromagnetic field.

7. The integrated circuit yielded by the method of claim 5 wherein the step of emitting energy from a transducer driven by the output signal comprises the step of radiating optical energy.

8. The integrated circuit yielded by the method of claim 5 wherein the step of generating an oscillating carrier signal comprises the steps of:

generating an oscillating carrier signal at a particular frequency; and periodically changing the frequency of the oscillating carrier signal according to a repeating numeric sequence.

9. The integrated circuit yielded by the method of claim 5 wherein the step of varying the oscillating carrier signal according to the telemetry stream comprises the step of varying the amplitude or the frequency of the carrier signal according to the telemetry stream.

10. The integrated circuit yielded by the method of claim 5 wherein the step of varying the oscillating carrier signal according to the telemetry stream comprises the step of shifting the phase of the carrier signal according to the telemetry stream.

11. The integrated circuit yielded by the method of claim 1 wherein the step of modulating an output signal according to the telemetry stream comprises the step of setting the output signal active or inactive according to the telemetry stream.

12. The integrated circuit yielded by the method of claim 11 wherein the step of emitting energy from a transducer driven by the output signal comprises the step of radiating optical energy.

13. An integrated circuit comprising:

application specific circuitry comprising a plurality of test points;

test point capture circuit that captures the electrical state of the predefined test points;

telemetry formatter that creates a telemetry stream by incorporating the captured electrical state of the test points;

modulator that generates a modulated output signal according to the telemetry stream; and transducer that emits energy according to the modulated output signal.

14. The integrated circuit of claim 13 wherein the test point capture circuit comprises:

comparator that outputs a binary logic level in accordance with the voltage present at the test point; and flip-flop that stores the binary logic level in accordance with a sample signal.

15. The integrated circuit of claim 13 wherein the test point capture circuit comprises:

analog-to-digital converter that generates a digital value representative of the voltage present at the test point; and register that stores the digital value.

16. The integrated circuit of claim 13 wherein the telemetry formatter comprises:

control state machine that:

generates a load signal for capturing data;

generates a frame start identifier by selectively varying the state of a telemetry stream; and generates a shift signal when captured data needs to be output as a serial data stream;

shift register that:

stores a plurality of data bits if the load signal is received; and generates a digital data stream if the shift signal is received.

17. The integrated circuit of claim 13 wherein the modulator comprises:

oscillator that generates an oscillating carrier signal; and adjustment circuit that varies the oscillating carrier signal according to the telemetry stream.

18. The integrated circuit of claim 17 wherein the transducer comprises an antenna that emits the oscillating carrier signal.

19. The integrated circuit of claim 17 wherein the transducer comprises an optical emitter that emits light in accordance with the oscillating carrier signal.

20. The integrated circuit of claim 17 wherein the oscillator comprises:

numeric sequence generator that generates a periodic sequence of digital values; and numerically controlled frequency synthesizer that generates an oscillating signal in accordance with the digital value generated by the numeric sequence generator.

21. The integrated circuit of claim 17 wherein the adjustment circuit comprises an amplitude modulator that adjusts the amplitude of the oscillating carrier signal according to the telemetry stream or wherein the oscillator varies the frequency of the oscillating carrier signal according to a control voltage and the adjustment circuit comprises a frequency modulator that generates a control voltage according to the telemetry stream.

22. The integrated circuit of claim 17 wherein the adjustment circuit comprises a phase shifter that shifts the phase of the oscillating carrier signal in accordance with the telemetry stream.

23. The integrated circuit of claim 13 wherein the modulator comprises a comparator that outputs a logic level in accordance with the telemetry stream.

24. The integrated circuit of claim 23 wherein the transducer is an optical emitter that is enabled according to the logic level output by the modulator.

* * * * *